United States Patent [19]

Lohstroh

[11] 4,245,233

[45] Jan. 13, 1981

[54] PHOTOSENSITIVE DEVICE ARRANGEMENT USING A DRIFT FIELD CHARGE TRANSFER MECHANISM

[75] Inventor: Jan Lohstroh, Eindhoven, Netherlands

[73] Assignee: U.S. Philips Corporation, New York, N.Y.

[21] Appl. No.: 12,164

[22] Filed: Feb. 14, 1979

Related U.S. Application Data

[63] Continuation of Ser. No. 824,392, Aug. 15, 1977, abandoned.

[30] Foreign Application Priority Data

Aug. 26, 1976 [GB] United Kingdom ............... 35533/76

[51] Int. Cl.³ .................... H03K 3/42; G11C 19/28; H01L 29/78; H01L 27/14
[52] U.S. Cl. ................................. 307/311; 357/24; 357/30; 357/59; 307/221 D; 307/355
[58] Field of Search .............................. 357/23, 24, 30; 307/221 D, 311

[56] References Cited

U.S. PATENT DOCUMENTS

| | | | |
|---|---|---|---|
| 3,623,132 | 11/1971 | Green | 357/24 |
| 3,796,932 | 3/1974 | Amelio et al. | 357/24 |
| 3,796,933 | 3/1974 | Arnett et al. | 357/24 |
| 3,858,232 | 12/1974 | Boyle et al. | 357/24 |
| 4,012,759 | 3/1977 | Esser | 357/24 |
| 4,019,199 | 4/1977 | Chamberlain et al. | 357/24 |
| 4,067,001 | 1/1978 | Hoffmann | 357/24 |
| 4,168,444 | 9/1979 | Santen | 307/311 |

OTHER PUBLICATIONS

Heller et al., "Ramp Potential MIS Device", IBM Tech. Disclosure Bulletin, vol. 13, (4/71), p. 3559.
Heller et al., "Random Access Potential Ramp Memory for Charge-Coupled Device", IBM Tech. Disclosure Bulletin, vol. 14, (7/71), pp. 485–486.
Krumme et al., "Photoconductive/Magneto-Optic Storage Material", J. Applied Physics, vol. 46, (6/75), pp. 2733–2736.

*Primary Examiner*—Gene M. Munson
*Attorney, Agent, or Firm*—Thomas A. Briody; Robert T. Mayer; Steven R. Biren

[57] ABSTRACT

A photosensitive element and a photosensitive device arrangement using the element include a charge transfer structure having an electrode layer extending over a photosensitive area of a semiconductor body. In operation, a bias potential is applied to the electrode layer to form a depletion layer in the underlying body portion, and a drift field is produced in the depletion layer which extends in the direction of an edge portion of the electrode layer to permit photogenerated charge carriers to be transmitted towards the edge portion. A preferred structure for producing the desired drift field includes a resistive electrode having first and second connections for applying a potential difference along the resistive electrode. The photosensitive device arrangement further includes a localized charge-storage zone adjacent the edge portion of the electrode layer for collecting the photogenerated charge carriers and a detector circuit for measuring the charge state of the charge-storage zone.

8 Claims, 10 Drawing Figures

PHOTOSENSITIVE DEVICE ARRANGEMENT USING A DRIFT FIELD CHARGE TRANSFER MECHANISM

This is a continuation of application Ser. No. 824,392, filed Aug. 15, 1977, now abandoned.

This invention relates to photosensitive device arrangements comprising a semiconductor body having a photosensitive element which operates in a charge-transfer and charge-storage mode, and further relates to photosensitive elements for such device arrangements and to systems including such device arrangements.

Photosensitive device arrangements comprising a semiconductor body having a photosensitive element which operates in a charge-transfer and storage mode are known. Generally such known device arrangements comprise an array of such photosensitive elements, see for example U.S. Pat. No. 3,896,474. The photosensitive elements include a semiconductor body portion of one conductivity type and an electrode layer which is separated from a major surface of the body portion by a barrier layer which is usually of insulating material; the electrode layer extends over a photosensitive area of said body portion, in which photosensitive area mobile charge-carriers can be generated in response to the incident radiation to be detected. The electrode layer in these known devices provides a photo-gate of the photosensitive element. A uniform depletion layer with associated potential-well is formed capacitively in the photosensitive area of the said semiconductor body portion when a potential is applied to the photo-gate. The charge-carriers generated by the incident radiation are stored in the said uniform potential-well. Subsequently when the potential of the photo-gate is clocked to a lower value, the potential well disappears and the stored charge-carriers transfer sideways into, for example, charge-transfer shift-registers along which they are transported to charge-detection circuitry.

The present invention relates particularly, but not exclusively, to a charge-transfer and charge-storage mode photosensitive element which may have a comparatively large photosensitive area and can detect or measure small photon densities, for example a density not greater than approximately $10^{12}$ photons per sq. cm. per sec. Such an element would be useful as, for example, a photodetector in a magneto-optical memory system.

The known charge-storage mode photosensitive elements described hereinbefore are designed to have a small photosensitive area. Typically said area may be 100 sq. microns or smaller. If the elements are designed to have a larger photosensitive area and photo-gate area, (for example of the order of one square millimeter, or larger) then when the potential of the photo-gate is clocked to a lower value, a part of the stored charge may be too remote to transfer from the photosensitive area so that the signal obtained does not correspond to the intensity of the incident radiation. Thus if the photon density incident on such a larger-area photosensitive element is small, the resulting signal error may be considerable.

In accordance with the present invention the mobile charge carriers generated in the photosensitive area of the said semiconductor body portion under the electrode layer are transferred towards a localized charge-storage site adjacent a portion of the electrode layer by means of a drift field in the depletion layer formed in the body portion under the electrode layer, which drift-field extends across said photosensitive area in the direction of said charge-storage site. Even with a very large photosensitive area and a low photon density, generated charge-carriers from across the whole of the photosensitive area can be transported in this manner towards the charge-storage site and can be detected as a change in the charge-state or potential at said site.

Thus, according to one aspect of the present invention a photosensitive device arrangement is characterized in that photosensitive area mobile. charge-carriers can be generated in response to the incident radiation to be detected, which electrode-layer forms with said underlying body portion a charge-transfer structure having means for applying bias potential to the electrode layer to form a depletion layer capacitively in said underlying body portion during operation and without inverting the conductivity type across the surface of said body portion, and means to produce in said depletion layer a drift field which extends across said photosensitive area, substantially parallel to said major surface and in the direction of an edge portion of said electrode layer so that photo-generated charge-carriers from the whole of said photosensitive area are transported along said drift-field towards said edge portion, means being present to define a charge-storage zone locally in said body portion and adjacent said edge portion of said electrode layer for collecting the photo-generated charge-carriers transported thereto by said drift field, and means associated with said charge-storage zone for permitting the charge-state thereof to be detected.

In a photosensitive device arrangement in accordance with the present invention, or at least in a photosensitive element for such a device arrangement, the largest dimension of said charge-storage zone may be much smaller (for example at least an order of magnitude smaller) than the smallest dimension parallel to said major surface across the whole of said photosensitive area underlying the electrode layer. Thus, the charge-storage zone can have a very small capacitance so that even small changes in its charge state can result in large detectable changes in its potential. Such an element is particularly suitable for detecting or measuring low photon densities, for example over large areas. Said smallest dimension across the photosensitive area may be, for example, at least 1 n.m., and said photosensitive area underlying said electride layer may be, for example, at least 1 sq. m.m.

The barrier layer is preferably an insulating layer, although it may also be for example a Schottky junction or a p-n junction between the electrode layer and the underlying semiconductor body portion.

In photosensitive elements and device arrangements in accordance with the present invention, the drift field for transporting said photo-generated charge-carriers may be produced by a varying threshold voltage along the electrode-insulator-semiconductor structure formed by the insulated electrode layer and the underlying semiconductor body portion. Thus for example the electrode layer may comprise a photo-gate electrode having a single connection for applying a potential thereto to bias the electrode relative to said the semiconductor body portion; in such a case the drift field below this electrode can be obtained by providing (for example by implantation) a doping gradient along the surface of the semiconductor body portion below the electrode or by incorporating in the insulating layer (for example by implantation) a quantity of charge which varies along the length of the electrode, or by having an insulating layer the thickness of which decreases with distance along the electrode and towards the charge-storage zone.

In a presently-preferred form, the electrode-layer comprises a resistive electrode which extends over the photosensitive area and has first and second connections for applying a potential difference along said resistive electrode to produce the drift field in the underlying body portion. Such a resistive electrode structure is generally speaking much easier to manufacture in a reproducible manner at the present time than are the varying-threshold voltage structures hereinbefore described.

In a simple preferred embodiment such a device arrangement having a resistive electrode may be operated with a fixed potential difference applied between the first and second connections. However, in some cases the small current flowing through the resistive electrode between the connections in operation of the device may result in undesirable heat dissipation. Thus, in another preferred embodiment, means may be present for applying to one of said first and second connections a voltage pulse to permit the photo-generated charge-carriers to be accumulated below said resistive electrode when, in the absence of said pulse, the said one connection is at the same potential as the other connection and the charge carriers are transported towards said charge-storage zone when the pulse is applied to establish said potential difference between the connections. Heat dissipation in the resistive electrode can therefore be reduced by reducing the period during operation when said potential difference is present.

As will be discussed hereinafter, many configurations for such a resistive-electrode layer structure are possible. In one form, the charge-storage zone and said first connection are present adjacent one corner of the resistive electrode, and said second connection is present adjacent an opposite corner of said resistive electrode. In another form, the electrode layer further comprises an elongate resistive electrode which has a smaller area and extends alongside the other resistive electrode, said first connection being present adjacent this elongate resistive electrode, said second connection being present adjacent the opposite edge of said other resistive electrode, said charge-storage zone being provided adjacent one end of said elongate resistive electrode having connections adjacent its ends for applying a potential difference therebetween to produce in the underlying body portion a drift field in the direction of said charge-storage zone.

To permit the charge-storage zone to be temporarily connected in operation to a potential source for resetting the potential of said zone prior to the collection of said photogenerated charge carriers, the charge-storage zone may be provided with switchable connection means which may be, for example, an insulated-gate field-effect transistor. Such a transistor may be provided in said body portion, and said charge-storage zone may also form a main electrode zone of said transistor; in this manner a particularly compact structure can be obtained. However, it will be evident that other means are possible for resetting the charge-state and potential of the charge-storage-zone, prior to the charge-collection.

In some forms of photosensitive element in accordance with the invention, the charge-storage zone may be a potential well which is formed capacitively in the semiconductor body portion below an insulated-gate electrode. With such a gate structure, the floating-gate amplifier principle can be used for charge-detection.

The charge-storage zone may be a doped zone which is of opposite conductivity type to said body portion and which is locally provided therein to form therewith a p-n junction. Such an opposite type zone can collect and store charge-carriers of said opposite conductivity type, after the potential of said zone has been set by temporarily applying a reverse voltage. However, when the insulated electrode layer forms with the underlying body portion of said one conductivity a so-called bulk charge-transfer structure for charge-carriers of said one conductivity type, the semiconductor zone forming the charge-storage zone may be a part of said body portion of the one conductivity type.

The charge-transfer structure formed by the insulated electrode layer and the underlying body portion may be of the surface-channel charge-transfer type, in which minority charge-carriers (i.e. charge-carriers of said opposite conductivity type) are transported adjacent the surface of said body portion below said insulated electrode layer. However, the charge-transfer structure may be of the bulk-channel charge-transfer type in which majority charge-carriers (i.e. charge carriers of said one conductivity type) are transported along a potential minima in the bulk of said body portion so avoiding surface-states which may trap mobile charge-carriers and reduce the efficiency of transfer. Preferably such a bulk-channel charge-transfer structure has a more highly doped surface layer of the one conductivity type in said body portion in order to obtain an advantageous doping profile as described in, for example, co-pending British Patent Application No. 11974/74 corresponding to published Dutch Application No. 7303778 and U.S. Pat. No. 4,012,759.

The charge-state of said charge-storage zone can be detected in many ways. Many forms of charge-detection circuitry are suitable for connection to electrode means associated with said charge-storage zone for permitting the charge-state thereof to be read. Said electrode means may comprise for example an insulated sensing-gate electrode provided over said zone. However, preferably the electrode means contacts said zone, and so directly attains the potential of said zone. A circuit for detecting the charge-state of said zone may be integrated in the same semiconductor body as said photosensitive element, so resulting in a compact device structure. The charge-state of said charge-storage zone may be detected by a circuit which compares the potential of said zone with that of a corresponding zone which has not collected charge-carriers generated by the incident radiation and which switches an output stage from one state to another if any difference between said potentials exceeds a predetermined value. In this manner a positive indication of the presense or absence of incident radiation can be obtained.

Photosensitive elements and device arrangements in accordance with the present invention can be particularly advantageous for reading a magneto-optical memory. Thus, in accordance with a further aspect of the present invention there is provided a magneto-optical memory system, in which a photosensitive device arrangement in accordance with the invention is provided for detecting optical radiation representative of the memory state of individual storage sites of a magneto-optical memory. Usually such a memory is read by deflecting a laser beam or other light beam to individual storage sites and analyzing the plane of polarization of the transmitted beam. In such a system, the charge-state of a photosensitive device in accordance with the invention can be detected each time the beam is switched to an individual memory site.

However photosensitive elements and device arrangements in accordance with the present invention may be used in other applications, for example in an exposure-meter for a camera. In this case, a Schmidt trigger circuit, for example, may be used to continuously monitor the potential of the charge-storage zone and to switch (and perhaps close the camera shutter) when a certain potential level corresponding to a desired exposure is reached.

Embodiments of various aspects of the present invention will now be described, by way of example, with reference to the accompanying diagrammatic drawings, in which.

It will be appreciated that the drawings are diagrammatic and not to scale, the dimensions of some regions and layers having been exaggerated with respect to others for the sake of clarity.

Figure 1:
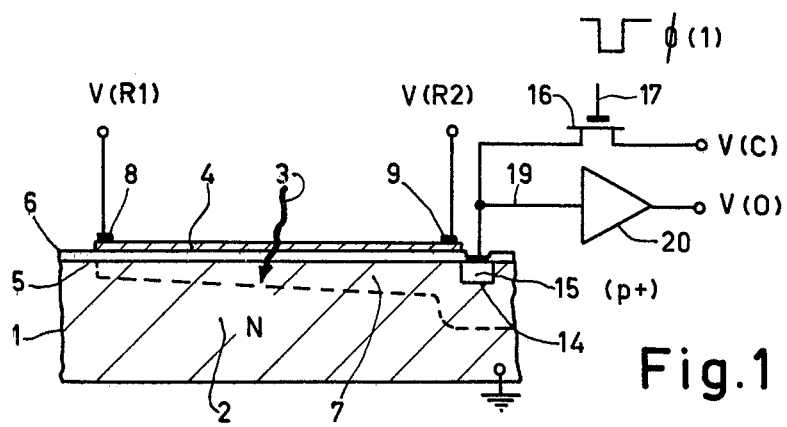
FIG. 1 is a cross-sectional view of a photosensitive element in a photosensitive-device arrangement in accordance with the present invention.
Figure 2:
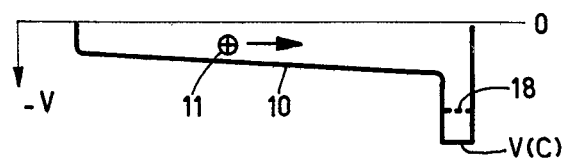
FIGS. 2 and 3 show potential profiles in the device body of the photosensitive element of FIG. 1.

The photosensitive device illustrated in FIG. 1 comprises a semiconductor body 1 having a photosensitive element. The body 1 is typically of, for example, monocrystalline silicon. The photosensitive element includes a portion 2 of said body of one conductivity type and an electrode layer 4 which is separated from a major surface 5 of said body portion 2 by a barrier layer 6 and extends over a photosensitive area of the body portion 2. In the device of FIG. 1, the barrier layer 6 is an insulating layer which may be of, for example, silicon oxide and is permeable to the radiation 3 to be detected. In this photosensitive area below the electrode 4 mobile charge-carriers are generated in response to the incident radiation 3 to be detected. The insulated electrode layer 6 forms with the underlying body portion 2 a charge-transfer structure for transporting photogenerated charge-carriers (in this case minority charge-carriers) along a drift-field in a depletion layer 7. The depletion layer 7 is formed capacitively in said underlying body portion 2 during operation by the application of bias potentials V(R1) and V(R2) to the electrode layer 4 and without inverting the conductivity type at the surface of said body portion 2. In the device of FIG. 1, the electrode layer 4 comprises a resistive electrode which is permeable to the electromagnetic radiation 3 to be detected and substantially the whole of which overlies said photosensitive area. The resistive electrode 4 has first and second connections 8 and 9 for applying a potential difference V(R2)−V(R1) along said electrode 4 to produce the drift-field in the underlying body portion 2. This drift-field is represented by the potential gradient 10 shown in FIG. 2 and extends across the whole photosensitive area underlying electrode 4, and substantially parallel to the surface 5. The potential profile of FIG. 2 is taken along the surface 5. The magnitude of the potentials V(R1) and V(R2) are each greater than the threshold potential of the electrode-insulator-semiconductor capacitor structure 4, 6, 2.

As shown in FIGS. 1 and 2, the body portion 2 may be of n-type conductivity and provides in this case a surface-channel along which holes 11 of the electron-hole pairs generated by the radiation 3 can be transported adjacent the surface 5 below the electrode 4. The drift field 10 generated by the negative potentials V(R1) and V(R2) is in the direction of an edge portion of the insulated electrode layer 4 where a charge-storage zone 15 is provided. Thus, mobile photo-generated charge-carriers 11 from the whole of the photosensitive area of body portion 2 are transported by the drift field 10 towards the zone 15. There is a slight overlap between the zone 15 and the electrode layer 4.

The zone 15 is a semiconductor zone provided with switchable connection means 16 (in this case an insulated-gate field-effect transistor) to permit zone 15 to be temporarily connected in operation to a potential source V(C). By this means, the potential and charge-state of the zone 15 is reset prior to the collection of said mobile charge-carriers 11. In the device arrangement of FIGS. 1 and 2, the zone 15 is of opposite conductivity type (p-type) to that of the body portion 2, and the negative potential V(c) reverse-biases the p-n junction 14 between zone 15 and portion 2 when transistor 16 is opened prior to the collection of the carriers 11. The resulting potential well formed at the zone 15 has a lower value than the potential well formed under the insulated electrode structure 4. When the transistor 16 is then closed the pre-charged p-type zone 15 serves to collect and store the photo-generated holes 11, and as a result its potential becomes less negative as indicated by the broken line 18 in FIG. 2. The switch 16 can be opened and closed in known manner by a pulse $\phi(1)$ on its gate 17.

Electrode means 19 are associated with the zone 15 for permitting its charge-state to be detected. In the arrangement of FIG. 1, said electrode means 19 form an ohmic contact to the zone 15 and provide an output connection to the detector circuit 20. The output voltage V(O) of circuit 20 is determined by the charge-state and potential of zone 15.

In a typical but non-limiting example, the applied voltages V(R1) and V(R2) may be for example 4 volts negative and 5 volts negative respectively, and the applied voltage V(C) may be for example 10 volts negative. The body portion 2 is connected to earth (zero volts). The n-type body portion 2 may have a resistivity of for example 5 ohm-cm. The zone 15 may be formed therein by diffusion or implantation of a p-type impurity with a doping of for example $10^{17}$ or $10^{18}$ atoms per c.c. The insulating layer 6 may be of thermally-grown silicon oxide for example and have a thickness of for example 0.1 microns. The resistive electrode 4 may be of polycrystalline silicon deposited on the layer 6 and having a sheet resistance of for example $10^4$ ohms per square. The photosensitive area underlying electrode 4 may be for example, at least 1 sq. m.m.

Figure 4:
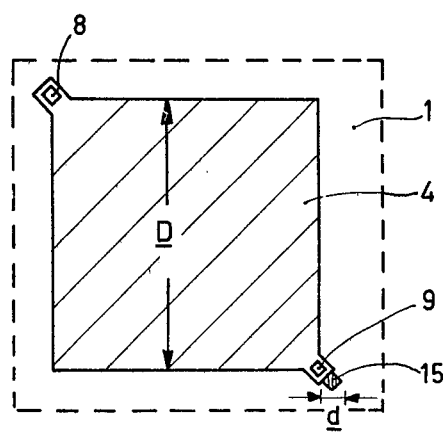
FIG. 4 is a plan view of a photosensitive element in accordance with the present invention, for use in such a device arrangement as that of FIG. 1.

Because of the drift-field 10, photo-generated holes 11 from the whole of the photosensitive area under electrode 4 drift towards the zone 15, so that a high collection efficiency can be obtained over the whole area. This is particularly advantageous for a large-area detector in particular for low photon density detection or measurement. The area of the detection zone 15 can be very small compared with the large photosensitive area of the device, so that zone 15 has a very small capacitance and thus produces a comparatively large and readily-detectable change in its potential as a result of the collection of the charge-carriers generated by even a low photon density, for example at most $10^{12}$ photons per sq. cm. per sec. In a typical case, the largest dimension d of said charge-storage zone 15 may be at least one or two orders of magnitude smaller than the smallest dimension D parallel to the said major surface 5 across the whole of said photosensitive area. Thus, for example d may be 10 microns, and D may be a thousand microns or greater, for example approximately 3 m.m. in the form shown in FIG. 4. In FIG. 4, the insulating layer 6 and contact to zone 15 are omitted for the sake of clarity; the contacts 8 and 9 are located adjacent opposite corners of the resistive electrode 4, and the zone 15 is at the corner adjacent the contact 9. The zone 15 and electrode 4 are shown cross-hatched in different directions.

Figure 3:
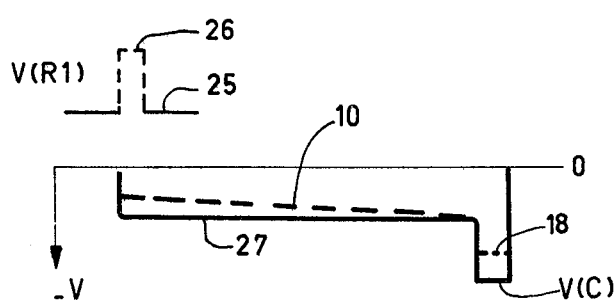

Undesirable heat may be dissipated in the resistive electrode 4 with a potential difference between connections 9 and 8. FIG. 3 illustrates a dissipation reducing method in which a voltage pulse V(R1) from a pulse generator is applied to connection 8, instead of a fixed potential. The clock pulse V(R1) has two levels, namely a first level 25 which is equal in magnitude to V(R2) applied to connection 9, and a second level 26 which is less in magnitude than V(R2). When V(R1) is at level 25, a uniform potential well 27 is formed below the electrode 4. Holes generated by the incident radiation 3 can accumulate in this well, and some may diffuse to zone 15. Thus, with level 25, the electrode 4 behaves as a conventional photo-gate electrode. At the end of the integration period the pulse level 26 is applied for a short period to produce the potential gradient and drift field 10. All the holes accumulated in the potential well 27 are then transported along said drift-field 10 to said zone 15.

Figure 5:
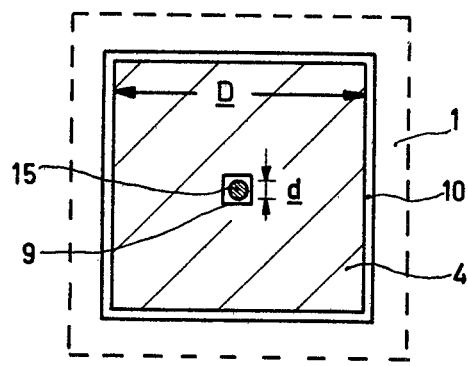
FIGS. 5 and 6 are plan views of modified photosensitive elements in accordance with the present invention.
Figure 6:
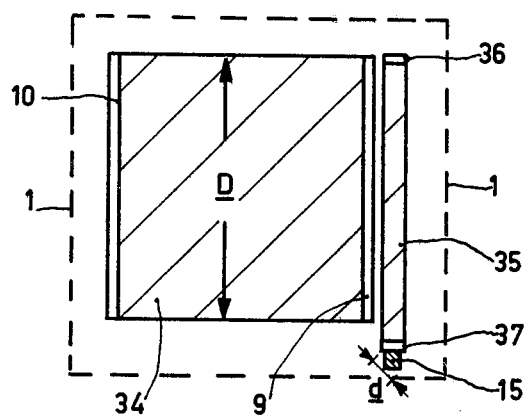

It will be evident that the novel charge-storage mode photosensitive element illustrated in FIGS. 1 and 4 can be modified in various ways. Thus, for example, FIGS. 5 and 6 illustrate in plan view different electrode layouts. In the photosensitive element illustrated in FIG. 5, the charge-storage zone 15 is laterally surrounded by the insulated resistive electrode 4; in this case connection 9 is provided around the inner edge of the resistive electrode structure adjacent the zone 15, and connection 8 is provided around the outer edge. An advantage of this FIG. 5 structure is a reduced transport-distance and time to zone 15 for charge-carriers generated in parts of the photosensitive area remote from zone 15. A disadvantage of this structure is that because of the electrode connection (not shown) to zone 15 a non-photosensitive center may be formed in the photosensitive area of the device, and the connections to 9 and 15 can extend across the photosensitive area.

A different device can be formed by modifying the structure of FIG. 5 to provide electrode 4 as a spiral, the inner end of which is provided with connection 9 adjacent the central zone 15, and the outer end of which is provided with connection 8.

FIG. 6 illustrates another photosensitive element according to the invention in which the resistive electrode layer 4 comprises a major portion 34 which is similar to the large area electrode of FIGS. 1 and 4, and an elongate portion 35 which extends along one side thereof. In this case, connection 9 of resistive electrode 34 is present adjacent the elongate resistive electrode 35 and connection 8 is present at the opposite edge of the electrode 34. The electrode 35 has connections 36 and 37 adjacent its opposite ends for applying a potential difference to produce in the underlying body portion a drift-field in the direction of the charge-storage zone 15. The drift-fields under electrodes 34 and 35 are substantially uniform and perpendicular to each other. Photo-generated charge-carriers drift first to the right-hand side under electrode 34 and then down the drift field below electrode 35 to the zone 15. For the sake of clarity in the drawing of FIG. 6, electrode 35 is shown spaced from electrode 34. In order to obtain efficient charge-transfer from electrode 34 to electrode 35 said spacing should be minimized. Preferably electrodes 34 and 35 will overlap each other, of course while maintaining mutual electrical insulation. Electrode 35 may overlie part of the photosensitive area of the device; it may alternatively be shielded from the incident radiation 3 so that said area is present only under electrode 34.

Figure 7:
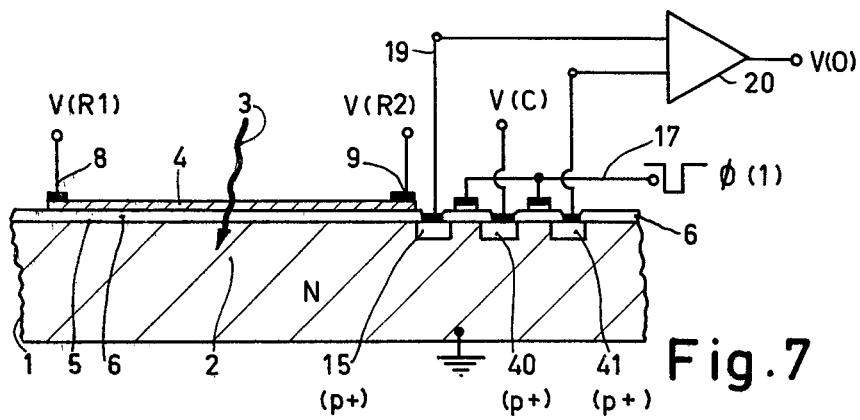
FIGS. 7 and 8 are cross-sectional views of different photosensitive elements in photosensitive-device arrangements in accordance with the present invention.

It will be evident that the photosensitive elements described with reference to FIGS. 4 to 6 are particularly suitable for use in an arrangement such as that of FIG. 1. Other modifications are of course possible. Thus, for example FIG. 7 illustrates a way of obtaining an advantageous, compact structure in which the insulated-gate field-effect transistor 16 is provided in the semiconductor body 1. In this form, the charge-storage zone forms one main electrode zone 15 of the transistor, and the other main electrode zone (to which voltage source V(C) is connected in operation) is provided by an adjacent spaced p-type zone 40. The transistor gate electrode 17 is present on part of the insulating layer 6 overlying the part of the n-type body portion between the zones 15 and 40. Thus, in this case, the switchable connection means 16 are a p-channel enhancement-mode transistor. FIG. 7 also illustrates a further possible modification, namely the provision of a reference charge-storage zone 41 which is equivalent to zone 15 but which does not change its charge-state and potential by collecting the photo-generated charges 11. This zone 41 need not have the same dimensions and doping as zone 15, but it does have the same junction capacitance and is pre-biased to the same potential as zone 15 by the voltage source V(C) via the transistor switch 16. The detector 20 then detects the difference in potential between zone 15 and zone 41. If desired, a second insulated resistive electrode structure equivalent to that associated with zone 15 may be associated with zone 41 but shielded from the incident radiation, to compensate zone 41 for the effect on zone 15 of the dark-current generated under the insulated resistive electrode structure 4, 6, 2.

Figure 8:
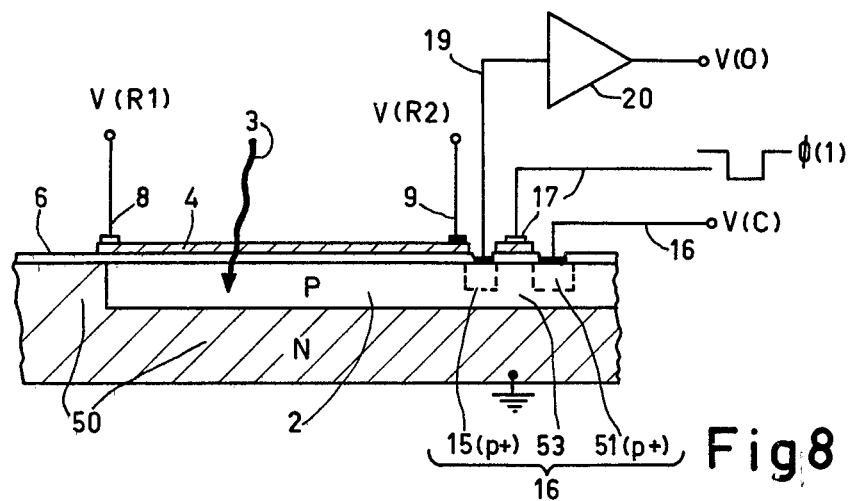

FIG. 8 illustrates a further modification in which a bulk-channel charge-transfer structure is used. In this case, the semiconductor body portion 2 may be, for example, a surface-adjoining island of opposite conductivity type (p-type), which forms a p-n junction with the surrounding portion 50 of said body 1. Bulk-channel charge-transfer structures are described in for example British Patent Specification No. 1,414,183, which corresponds to U.S. Ser. No. 866,004, which is a continuation of U.S. Ser. No. 504,372, now abandoned, which in turn is a continuation of U.S. Ser. No. 299,748, now abandoned, to which reference is invited. Preferably the whole surface of portion 2 is highly-doped, for example by ion implantation. As is known, by providing such a highly-doped surface layer, the bulk transfer-channel can be formed with an advantageous profile, for example as described in copending British Patent Application No. 11974/74 corresponding to published Dutch Application No. 83.03778 and U.S. Pat. No. 4,012,759. In addition due to the presence of the highly-doped surface layer, the value of the potential difference capacitively produced in the body portion 2 below the resistive electrode 4 can correspond more closely to that applied between connections 8 and 9 of said electrode 4. In this example, the charge-storage zone 15 is part of the p-type body portion 2, and may comprise a highly-doped p+ surface zone. This zone 15 forms one of the two main electrode zones 15 and 51 of a deep-depletion p-channel transistor switch 16 which can be closed (i.e. turned off) by a positive potential level on its gate electrode 17 so as to fully deplete the underlying p-type transistor channel portion 53. In this device, holes of the photo-generated electron-hole pairs are transported along the drift-field formed in the depletion-layer below the biased resistive electrode 4.

Figure 9:
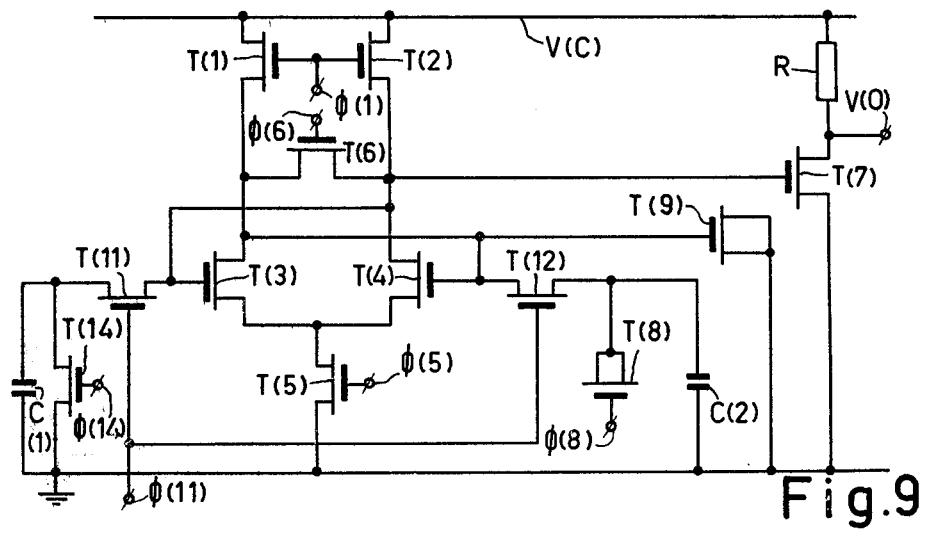
FIG. 9 is a circuit diagram of a detector circuit in a photosensitive-device arrangement in accordance with the present invention.

In order to detect small changes in the charge-state of zone 15 in device arrangements in accordance with the present invention, a detector circuit 20 having a small input capacitance is desirable. FIG. 9 illustrates one example of such a circuit comprising p-channel enhancement-mode insulated-gate field-effect transistors which can be integrated in the same semiconductor body as the photosensitive element. The circuit is of known type and compares the potential of zone 15 (represented by capacitor C(1), for example 0.1 pico.-Farads) with the potential of a corresponding zone (represented by capacitor C(2), 0.1 pF). The zone represented by C(2) is provided in the same semiconductor body but has not collected charge-carriers generated by the incident radiation 3. If any difference between said potentials does not exceed a predetermined threshold value, then (when transistors T(1), T(2) and T(5) are turned on) the flip-flop transistor T(3) will conduct and will switch off amplifying output transistor T(7) to give a high negative output voltage V(0). If any difference between the potentials of C(1) and C(2) does exceed the predetermined threshold value, then (when transistors T(1), T(2) and T(5) are turned on) the flip-flop transistor T(4) will conduct and will switch on output transistor T(7) to give a low output level V(0).

Prior to the charge-collection and detection, the potentials on both sides of the flip-flop T(3) and T(4) are balanced by means of the transistor T6; the transistor T(8) having a short-circuited source and drain is used as a further capacitor associated with C(2) for introducing an imbalance into said flip-flop T(3) and T(4). The said predetermined threshold value of potential difference between C(1) and C(2) is determined by the amplitude of the negative voltage pulse $\phi(8)$ applied to the gate of transistor T(8) and the value of its gate capacitance. It should be noted that transistor T(2) is equivalent to the transistor switch 16 of FIG. 1. Thus, prior to charge-collection and detection, the initial potential and charge-state of the charge-storage zones represented by C(1) and C(2) are set by turning on transistors T(1) and T(2), when transistor T(5) is off and transistors T(11) and T(12) are conducting. Transistor T(11) is present for isolating the zone 15 represented by capacitor C(1) from the flip-flop T(3) T(4), immediately prior to turning on the transistors T(1), T(2) and T(5) for detecting the relative potential levels. Transistors T(12) and T(9) are present to balance the capacitance effects of transistors T(11) and T(7) respectively. Clock pulses $\phi(1)$, $\phi(5)$, $\phi(6)$, $\phi(8)$, $\phi(11)$ and $\phi(14)$, as indicated in FIG. 9, are applied to the gates of transistors for controlling the turn-on and turn-off of these transistors. These clock pulses can be supplied by pulse generators.

A further transistor T(14) may be provided to enable zone 15 to be temporarily connected to earth potential prior to charge-collection in order to fill charge-carrier traps at the surface 5 of the semiconductor body portion 2 under electrode 4, immediately prior to resetting the initial potential of zone 15 for charge collection. Such filling of surface-traps may also be effected in the arrangement of FIG. 1 by temporarily reducing the voltage V(C) to earth potential (for example by a clock-pulse) when transistor switch 16 is conducting and immediately prior to pre-charging zone 15 to its normal initial negative potential V(C).

Figure 10:
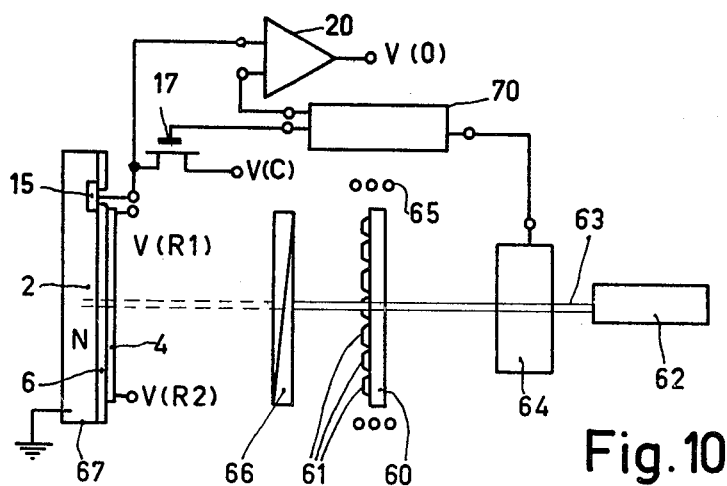
FIG. 10 is a cross-sectional illustration of a magneto-optical memory system in accordance with the present invention.

FIG. 10 illustrates a magneto-optical memory system in accordance with the present invention. Known magneto-optical memory systems are described in for example U.S. Pat. No. 3,164,816, German Offenlegungsschrift No. 2,357,301 (co-pending British Application No. 49110/74) and "Journal of Applied Physics", Vol. 46, No. 6, June 1975, pages 2733 to 2736, to all of which publications reference is invited. Such a system generally comprises a magneto-optical memory plate 60 having an array of memory storage sites 61. A laser or other light source arrangement 62 is generally used for both writing and reading the memory states of individual storage sites 61. The beam 63 generated by the arrangement 62 is deflected to address individual sites 61, by a deflection arrangement 64. The plate 60 is located within a magnetic-field coil 65 which is energized when writing different memory states in the plate 60. Reading is generally effected by using a polarized beam 63. After transmission through a storage site 61 the plane of polarization of the beam may be rotated dependent on the memory state of that site 61. The transmitted beam 63 is passed through a polarization analyser 66 which will transmit the beam 63 if it is polarized in one plane corresponding to one memory state but will not if it is polarized in another plane corresponding to another memory state. A photodetector 67 is then used to detect whether or not beam 63 is transmitted through analyzer 66.

In a magneto-optical memory system in accordance with the present invention, a photosensitive device arrangement in accordance with the present invention (for example a device arrangement as described with reference to the preceding Figures) is used for detecting the beam 63. The plate 60, analyzer 66 and detector 67 are provided in close proximity to each other, although for the sake of clarity of drawing, a considerable space is shown between these elements 60, 66 and 67 in FIG. 10. The photosensitive area of detector 67 is of the same order of magnitude as the area of the associated memory array of plate 60. Depending on the location of the memory site 61 being read, the beam 63 transmitted through analyzer 66 will be incident at different parts of the whole photosensitive area below the resistive electrode 4. Thus, the photon density over the whole photosensitive area of detector 67 will in general be small, for example $10^{12}$ photons per sq. cm. per sec. or less. However, at whatever location of the photosensitive area the beam 63 is incident, the holes generated therein by said beam 63 will be transferred towards the zone 15 by being transported along the drift-field 10 below the electrode 4, in accordance with the present invention.

The charge-state of zone 15 of the photosensitive device 67 is detected by detector 20 each time the beam 63 is switched to an individual site. The deflection arrangement 64 is controlled by a control unit 70. Control unit 70 also provides signals to detector 20 to detect said charge-state and to gate 17 of the switchable connection 16 of zone 15 to reset the potential of zone 15 to V(C) after detection.

It will be evident that many more modifications are possible within the scope of the present invention. Thus, for example the geometry, doping, resistivity and other properties of various portions can be chosen within wide limits. The conductivity type of the various semiconductor regions may all be simultaneously changed to the opposite type while of course also changing the polarity of the applied voltages. Other charge-transfer and storage media besides silicon, and other insulating layer materials and electrode materials may of course be used.

What is claimed is:

1. A photosensitive device arrangement comprising a semiconductor body having a photosensitive element responsive to incident radiation which operates in a charge-transfer and charge-storage mode, said photosensitive element comprising a semiconductor body portion of a first type conductivity, an insulating layer on a major surface of said body portion, an electrode layer on said insulating layer and extending over a photosensitive area of said body portion, in which photosensitive area mobile charge-carriers are generated in response to incident radiation to be detected, said electrode layer forming with said underlying body portion a charge-transfer structure having means for applying bias potential to the electrode layer to capacitively form a depletion layer in said underlying body portion during operation without inverting the conductivity type across the surface of said body portion, means for producing a drift field in said depletion layer which extends across said photosensitive area, substantially parallel to said major surface and in the direction of an edge portion of said electrode layer to cause photo-generated charge carriers from the entire photo-sensitive area to be transported along said drift field towards said edge portion, said means for producing the drift field comprising a first resistive electrode of said electrode layer which extends over said photosensitive area and has first and second connections for applying a potential difference along said first resistive electrode and a second, elongate resistive electrode of said electrode layer which extends alongside the first resistive electrode, is electrically insulated therefrom, and has a smaller area than said first resistive electrode, said first connection to the first resistive electrode being present adjacent the elongate resistive electrode and said second connection thereto being present adjacent an opposite edge of said first resistive electrode, a localized charge-storage zone in said body portion and adjacent said edge portion of said electrode layer for collecting the photo-generated charge carriers transported to said charge-storage zone by said drift field, the largest dimension of said charge-storage zone being at least an order of magnitude smaller than the smallest dimension across the entire photosensitive area underlying the electrode layer measured parallel to said major surface, said charge-storage zone being provided adjacent one end of said elongate resistive electrode and said elongate resistive electrode having connections adjacent its opposite ends for applying a potential difference therebetween to produce a drift field in the underlying body portion in the direction of said charge-storage zone, and means associated with said charge-storage zone for detecting the charge state of said charge-storage zone.

2. A photosensitive device arrangement as claimed in claim 1, in which the charge-storage zone is provided with switchable connection means to permit said zone to be temporarily connected to a potential source for resetting the potential of said zone prior to the collection of photo-generated charge carriers.

3. A photosensitive device arrangement as claimed in claim 2 in which said switchable connection means is an insulated-gate field-effect transistor which is provided in said body portion and in which said charge-storage zone also forms a main electrode zone of said transistor.

4. A photosensitive device arrangement as claimed in claim 2 in which the charge-storage zone is a doped zone of opposite type conductivity to that of said body portion and is locally provided therein to form therewith a p-n junction.

5. A photosensitive device arrangement as claimed in claim 2 in which the insulated electrode layer forms with the underlying body portion of said first type conductivity a bulk-channel charge-transfer structure for charge-carriers of said first type conductivity, and the semiconductor zone forming the charge-storage zone is a part of said body portion of the first type conductivity.

6. A photosensitive device arrangement as claimed in claim 1, in which a circuit for detecting the charge-state of said charge-storage zone is integrated in the same semiconductor body as said photosensitive element.

7. A photosensitive device arrangement as claimed in claim 6, in which the charge-state of said charge-storage zone is detected by said detecting circuit which compares the potential of said zone with that of a corresponding zone which has not collected charge-carriers generated by the incident radiation, and which switches an output stage from one state to another if any difference between said potentials exceeds a predetermined value.

8. A magneto-optical memory system, in which a photosensitive device arrangement claimed in claim 1 is provided for detecting optical radiation representative of the memory state of individual storage sites of a magneto-optical memory.

* * * * *